(12) United States Patent
Naitoh

(10) Patent No.: US 7,170,145 B2
(45) Date of Patent: Jan. 30, 2007

(54) METHOD OF MANUFACTURING SEMICONDUCTOR DEVICE, FLEXIBLE SUBSTRATE, AND SEMICONDUCTOR DEVICE

(75) Inventor: Katsuyuki Naitoh, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 205 days.

(21) Appl. No.: 10/808,398

(22) Filed: Mar. 25, 2004

(65) Prior Publication Data

US 2004/0214375 A1   Oct. 28, 2004

(30) Foreign Application Priority Data

Apr. 28, 2003   (JP) .............................. 2003-123965

(51) Int. Cl.
*H01L 31/117* (2006.01)
*H01L 23/02* (2006.01)

(52) U.S. Cl. ...................... 257/616; 257/686; 257/632; 257/778; 257/E23.065

(58) Field of Classification Search ................ 257/616, 257/734, 738, 698, 668, 773–783, E21.511, 257/E21.504, 632, E23.065, 685–689, 666
See application file for complete search history.

(56) References Cited

U.S. PATENT DOCUMENTS

| 5,777,386 | A  | * | 7/1998 | Higashi et al. ............. 257/737 |
| 6,204,564 | B1 | * | 3/2001 | Miyata et al. .............. 257/778 |
| 6,380,620 | B1 | * | 4/2002 | Suminoe et al. ............ 257/706 |
| 6,388,339 | B1 | * | 5/2002 | Yamamoto et al. ......... 257/787 |
| 6,392,143 | B1 | * | 5/2002 | Koshio ...................... 174/52.4 |
| 6,518,649 | B1 | * | 2/2003 | Iwane et al. ................. 257/668 |
| 6,784,530 | B2 | * | 8/2004 | Sugaya et al. .............. 257/686 |
| 6,917,104 | B2 | * | 7/2005 | Hashimoto .................. 257/734 |
| 2002/0047133 | A1 | * | 4/2002 | Nakahara et al. ........... 257/124 |
| 2004/0061240 | A1 | * | 4/2004 | Seko .......................... 257/782 |
| 2004/0066635 | A1 | * | 4/2004 | Terada et al. ............... 361/749 |
| 2005/0151235 | A1 | * | 7/2005 | Yokoi ......................... 257/685 |

FOREIGN PATENT DOCUMENTS

| JP | 64-059827   | 3/1989 |
| JP | 2000-021935 | 1/2000 |
| JP | 2001-176918 | 6/2001 |

OTHER PUBLICATIONS

Chinese Office Action mailed Nov. 25, 2005 (w/English translation thereof).

* cited by examiner

*Primary Examiner*—B. William Baumeister
*Assistant Examiner*—Igwe U. Anya
(74) *Attorney, Agent, or Firm*—Nixon & Vanderhye P.C.

(57) ABSTRACT

A semiconductor chip 6 is mounted on a flexible substrate 1 wherein internal connecting electrodes 4 to be connected to protruding electrodes 7 on an element surface of the semiconductor chip 6 and wires 3 for connecting the internal connecting electrodes 4 and the external connecting electrodes to be connected to external devices are provided on a surface of an insulating film 2. The internal connecting electrodes 4, the wires 3 and the surface of the insulating film 2 are coated with a protective film 5. The protruding electrodes 7 and the internal connecting electrodes 4 are connected by arranging the element surface of the semiconductor chip 6 to face the flexible substrate 1 and causing the protruding electrodes 7 on the element surface to pierce the protective film 5. This semiconductor device manufacturing method makes it possible to prevent ion migration and reduce occurrence of short circuit between wires.

6 Claims, 4 Drawing Sheets

METHOD OF MANUFACTURING SEMICONDUCTOR DEVICE, FLEXIBLE SUBSTRATE, AND SEMICONDUCTOR DEVICE

This Nonprovisional application claims priority under 35 U.S.C. § 119(a) on Patent Application No. 2003-123965 filed in Japan on Apr. 28, 2003, the entire contents of which are hereby incorporated by reference.

BACKGROUND OF THE INVENTION

1. Field of the Invention

The present invention relates to a method of manufacturing a semiconductor device by mounting a semiconductor chip onto a flexible substrate, and also relates to a flexible substrate and a semiconductor device.

2. Description of Related Art

FIG. 1 is a vertical sectional view showing a mount example in a conventional semiconductor device. This semiconductor device is an example applied to a driver of a liquid crystal display. In a flexible substrate 101, a pattern of Cu wiring 103 with a thickness of 12 μm is formed on a base material 102 made of a 40-μm polyimide film. The Cu wiring 103 is plated with about 0.2-μm thick Sn (not shown). A pattern of semiconductor chip connecting electrodes 104 on the flexible substrate 101 is also collectively formed and plated in the same manner as the wiring pattern of Cu wiring 103.

FIG. 2 is an enlarged plan view of a part of the flexible substrate 101 onto which a semiconductor chip 106 (see FIG. 1) is mounted. In order to protect the Cu wiring 103 from pollution and mechanical damage, the flexible substrate 101 is coated with a solder resist 105, whereas the semiconductor chip connecting electrodes 104 are, of course, not coated with the solder resist 105 because they are to be connected to the semiconductor chip 106 (see FIG. 1). It is difficult to open only the portions of the semiconductor chip connecting electrodes 104 by the solder resist film formation using a printing method, and therefore, in general, rectangular portions having lines of the semiconductor chip connecting electrodes 104 as four sides are not coated. The opening in the solder resist 105 is referred to as a device hole 109.

Note that, although not shown in the drawings, an output terminal line for connecting the flexible substrate 101 to a liquid crystal display is also not coated with the solder resist 105.

Au protruding electrodes 107 with a height of 10 μm and an area of 35 μm×80 μm (see FIG. 1), which are provided by plating on the semiconductor chip 106 (see FIG. 1) serving as a liquid crystal driver chip, and the semiconductor chip connecting electrodes 104 as a part of the wiring pattern (103) of the Sn-plated flexible substrate 101 are bonded by Au—Sn eutectic bonding by application of high-temperature heat and pressure. Since the planes of the element surface of the semiconductor chip 106 and the semiconductor chip mount surface of the flexible substrate 101 face each other in this Au—Sn eutectic bond, all the electrodes can be collectively connected under the same condition.

Thus, the semiconductor chip 106 is placed so that the element surface thereof faces the flexible substrate 101, and all the electrodes are connected by Au—Sn eutectic bonding. Conditions of a flip chip connection apparatus for obtaining the Au—Sn eutectic bond are a pressure of $170 \times 10^{-4}$ gf/μm², a tool temperature of 420° C., and a time of 1 second.

After connecting the semiconductor chip 106 (see FIG. 1) to the flexible substrate 101, a gap is generated between the flexible substrate 101 and the semiconductor chip 106 due to the Au protruding electrodes 107 and the semiconductor chip connecting electrodes 104. Therefore, the gap is then filled with synthetic resin 108 so as to protect the Au—Sn eutectic bond, the semiconductor chip 106, etc.

In the process of filling the synthetic resin 108, first, the synthetic resin 108 is continuously dropped from a dispenser onto the flexible substrate 101 along the edge of the semiconductor chip 106. The synthetic resin 108 spread on the flexible substrate 101 comes into contact with the edge of the semiconductor chip 106, and then enters and fills the interface between the flexible substrate 101 and the semiconductor chip 106 by capillary action. Thereafter, mounting of the semiconductor chip 106 onto the flexible substrate 101 is completed by thermosetting the synthetic resin 108.

The above-mentioned mounting configuration is referred to as COF (Chip On Film). This COF and TCP (Tape Carrier Package), which also uses a flexible substrate, are suitable for the mounting of semiconductor chips in apparatuses which are required to be light, thin and small, such as the mounting of a liquid crystal driver chip.

A similar structure is also described in a conventional example disclosed in Japanese Patent Application Laid-Open No. 2001-176918. As described in this application, in general, the connection section between a liquid crystal panel and electronic parts such as a semiconductor chip is not coated with a solder resist.

A liquid crystal driver chip is an IC chip for driving a liquid crystal display. The liquid crystal display includes liquid crystal filled in the space between two transparent plates. Since the liquid crystal has the problem of deterioration generated when the same potential is continuously applied, there have been developed liquid crystal driving methods in which the same potential is not continuously applied to the liquid crystal itself even when a still image is displayed on the screen, for example. Such driving methods include a line inversion method and a dot inversion method, and the dot inversion method is mainly used at present since it has the advantage to obtain a clearer screen image.

In the dot inversion method, a potential of different polarity is applied to each of adjacent wires of source wiring connected to a TFT (Thin Film Transistor), and the potential is inverted according to a clock cycle so as not to continuously apply a constant voltage to the liquid crystal. In this method, a voltage of a maximum of ten and several volts is sometimes applied between adjacent wires.

This voltage is supplied as an analog signal from the liquid crystal driver chip. Of course, a flexible substrate on which the liquid crystal driver chip is mounted receives this voltage.

When the flexible substrate is left under a high humidity environment in the state in which a voltage of ten and several volts is applied between adjacent wires on the flexible substrate, the interface resin absorbs moisture, and the moisture eventually reaches the flexible substrate.

Consequently, moisture is present between the wires to which the voltage is applied on the flexible substrate, and an ion migration phenomenon in which metal atoms migrate with a flow of current occurs, and causes the problem that a short circuit finally occurs between the wires to which the voltage of ten and several volts is applied. In particular, this phenomenon is noticeable in a portion that is not coated with the solder resist because the portion comes into contact directly with the moisture which has penetrated.

When the dot inversion method is employed as the liquid crystal driving method for the above-mentioned conventional flexible substrate, the reliability depends on the moisture absorbing rate of the interface resin, and it is actually impossible to prevent ion migration between wires in a portion that is not coated with the solder resist. Although there is no portion where the Cu wiring is exposed, it is difficult to prevent ion migration by only the synthetic resin since moisture penetrates into the synthetic resin and reaches the flexible substrate.

BRIEF SUMMARY OF THE INVENTION

The present invention has been made with the aim of solving the above problem, and it is an object of the present invention to provide a method of manufacturing a semiconductor device capable of preventing ion migration and reducing occurrence of short circuit between wires.

Another object of the present invention is to provide a flexible substrate capable of preventing ion migration and reducing occurrence of short circuit between wires in a state in which a semiconductor chip is mounted on the flexible substrate.

Still another object of the present invention is to provide a semiconductor device capable of preventing ion migration and reducing occurrence of short circuit between wires.

In a method of manufacturing a semiconductor device according to the present invention, a semiconductor chip is mounted on a flexible substrate in which a plurality of internal connecting electrodes to be connected to a plurality of protruding electrodes provided on an element surface of the semiconductor chip and a plurality of wires for connecting the internal connecting electrodes and a plurality of external connecting electrodes to be connected to external devices are provided on a surface of an insulating film, and the internal connecting electrodes, the wires and the surface of the insulating film are coated with a protective film. The protruding electrodes and the internal connecting electrodes are connected by positioning the semiconductor element surface so as to face the flexible substrate and causing the protruding electrodes provided on the element surface to pierce the protective film.

Accordingly, since moisture does not penetrate into the internal connecting electrodes and the wires, it is possible to realize the method of manufacturing a semiconductor device capable of preventing ion migration and reducing occurrence of short circuit between wires. Moreover, it is possible to prevent pollution, which accelerates ion migration, due to, for example, chlorine, reduce electrical defects such as a short circuit and leakage due to ion migration, and eliminate a so-called edge touch defect caused by contact of the semiconductor chip and the inner lead. Furthermore, since the semiconductor chip connecting electrodes do not touch the air in the processes after creating the wiring of the flexible substrate, including the process in which the protruding electrodes of the semiconductor chip come into contact with the semiconductor chip connecting electrodes of the flexible substrate, it is possible to eliminate Au—Sn connection defects due to oxidation of Sn.

In a flexible substrate according to the present invention, a plurality of internal connecting electrodes to be connected to a semiconductor chip and a plurality of wires for connecting the internal connecting electrodes and a plurality of external connecting electrodes to be connected to external devices are provided on a surface of an insulating film, and the plurality of wires is coated with a protective film. The internal connecting electrodes, the wires and the surface of the insulating film are coated with the protective film.

Accordingly, since moisture does not penetrate into the internal connecting electrodes and wires in a state in which the semiconductor chip is mounted on the flexible substrate, it is possible to realize the flexible substrate capable of preventing ion migration and reducing occurrence of short circuit between wires. Moreover, it is possible to prevent pollution, which accelerates ion migration, due to, for example, chlorine, reduce electrical defects such as a short circuit and leakage due to ion migration, and eliminate a so-called edge touch defect caused by contact of the semiconductor chip and the inner lead. Furthermore, since the semiconductor chip connecting electrodes do not touch the air in the processes after creating the wiring of the flexible substrate, including the process in which the protruding electrodes of the semiconductor chip come into contact with the semiconductor chip connecting electrodes of the flexible substrate, it is possible to eliminate Au—Sn connection defects due to oxidation of Sn.

In a semiconductor device according to the present invention, a semiconductor chip is mounted by positioning an element surface so as to face a surface of a flexible substrate of the present invention and connecting the element surface to the internal connecting electrodes of the flexible substrate.

Accordingly, since moisture does not penetrate into the internal connecting electrodes and wires, it is possible to realize the semiconductor device capable of preventing ion migration and reducing occurrence of short circuit between wires. Moreover, it is possible to prevent pollution, which accelerates ion migration, due to, for example, chlorine, reduce electrical defects such as a short circuit and leakage due to ion migration, and eliminate a so-called edge touch defect caused by contact of the semiconductor chip and the inner lead. Furthermore, since the semiconductor chip connecting electrodes do not touch the air in the processes after creating the wiring of the flexible substrate, including the process in which the protruding electrodes of the semiconductor chip come into contact with the semiconductor chip connecting electrodes of the flexible substrate, it is possible to eliminate Au—Sn connection defects due to oxidation of Sn.

The above and further objects and features of the invention will more fully be apparent from the following detailed description with accompanying drawings.

DETAILED DESCRIPTION OF THE INVENTION

Figure 3:
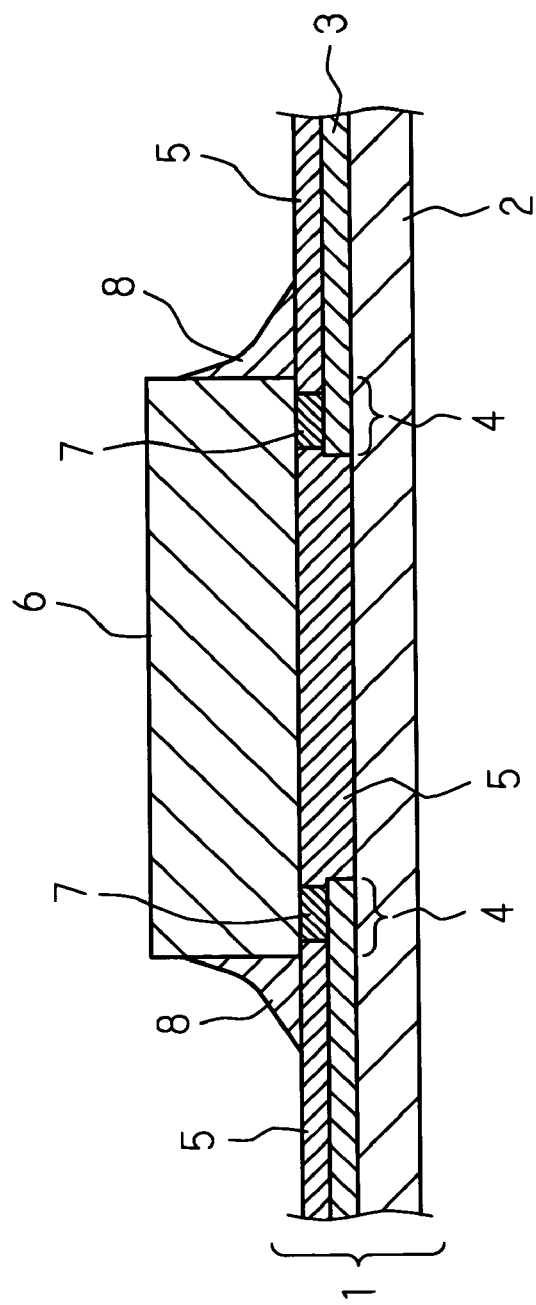
FIG. 3 is a vertical sectional view showing essential parts of an embodiment of a method of manufacturing a semiconductor device, a flexible substrate, and a semiconductor device according to the present invention.

FIG. 3 is a vertical sectional view showing essential parts of an embodiment of a method of manufacturing a semiconductor device, a flexible substrate, and a semiconductor device according to the present invention. This semiconductor device is an example applied to a driver of a liquid crystal display. In a flexible substrate 1, a pattern of Cu wiring 3 (wires) with a thickness of 12 μm is formed on a base material 2 (insulating film) made of a 40-μm polyimide film. The Cu wiring 3 is plated with about 0.2 μm thick Sn (not shown). A pattern of semiconductor chip connecting electrodes 4 (internal connecting electrodes) on the flexible substrate 1 is also collectively formed and plated in the same manner as the wiring pattern of the Cu wiring 3.

Figure 4:
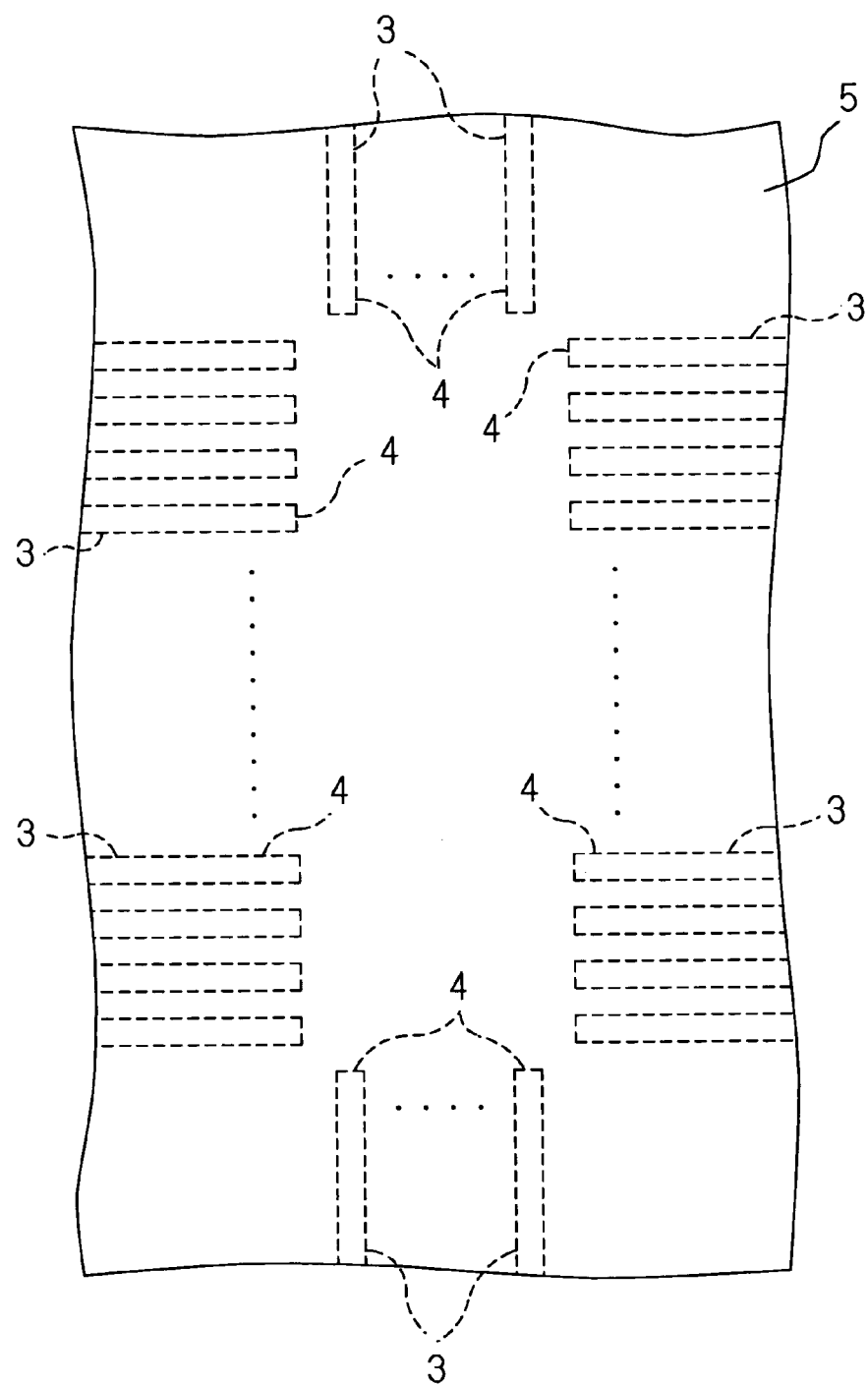
FIG. 4 is a plan view showing essential parts of an embodiment of a flexible substrate according to the present invention.

In order to protect the Cu wiring 3 from pollution and mechanical damage, the flexible substrate 1 is coated with a solder resist 5 (protective film) as shown in FIG. 4, except for an output terminal line (not shown) (external connecting electrodes) for connecting the flexible substrate 1 to a liquid crystal display.

Au protruding electrodes 7 (protruding electrodes) with a height of 15 μm and an area of 35 μm×80 μm formed on an element surface by plating are provided on a semiconductor chip 6 serving as a liquid crystal driver chip.

The present invention is the same as a conventional flip chip connection system in the point that the element surface of the semiconductor chip 6 and the flexible substrate 1 face each other and all the electrodes are collectively connected using a flip chip connection apparatus. However, the semiconductor chip connecting electrodes 4 of the flexible substrate 1 according to the present invention are also coated with the solder resist 5 in advance, and the Au protruding electrodes 7 of the semiconductor chip 6 pierce the solder resist 5 and are connected to the semiconductor chip connecting electrodes 4. This is the characteristic of the present invention.

The solder resist 5 coating the semiconductor chip connecting electrodes 4 as well as most of other parts is SN9000 available from Hitachi Chemical Co. Ltd., and has a thickness of about 7 μm. By setting a temperature of 420° C., a pressure of $170 \times 10^{-4}$ gf/μm$^2$ and a time of 1 second as the flip chip connection conditions, the Au protruding electrodes 7 pierce the solder resist 5 as described above and realize Au—Sn eutectic bonding with Sn of the semiconductor chip connecting electrodes 4.

Note that, in this embodiment, although the semiconductor device is manufactured by a manufacturing method in which the Au protruding electrodes 7 of the semiconductor chip 6 pierce the solder resist 5 so that the Au protruding electrodes 7 and the semiconductor chip connecting electrodes 4 are connected, the present invention also includes semiconductor devices manufactured by other methods.

Figure 1:
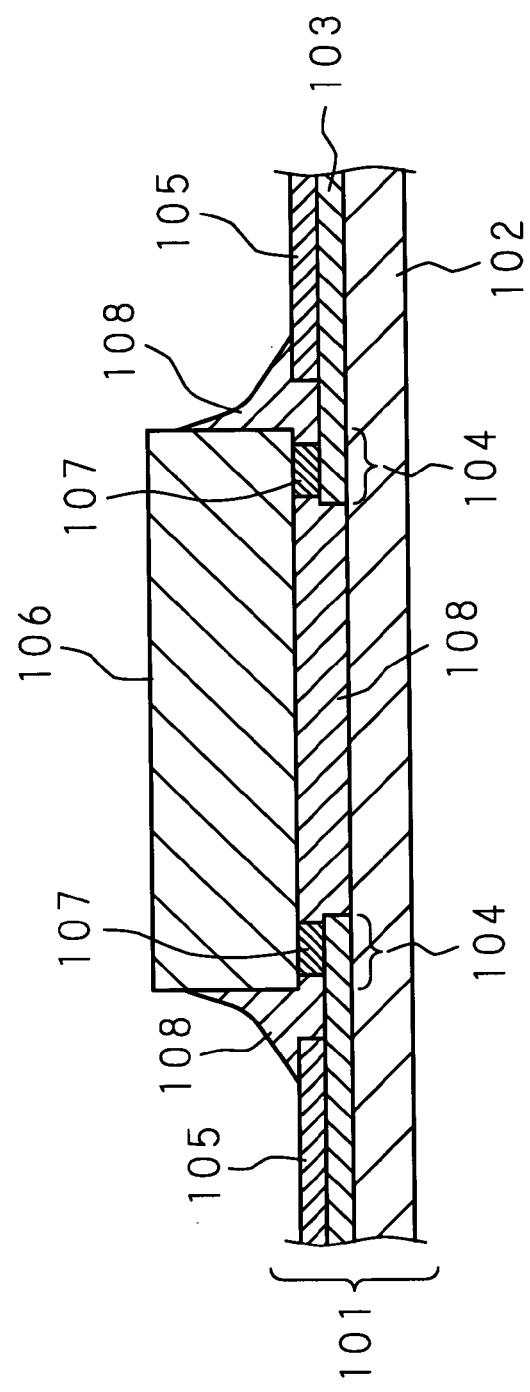
FIG. 1 is a vertical sectional view of a mount example in a conventional semiconductor device.
Figure 2:
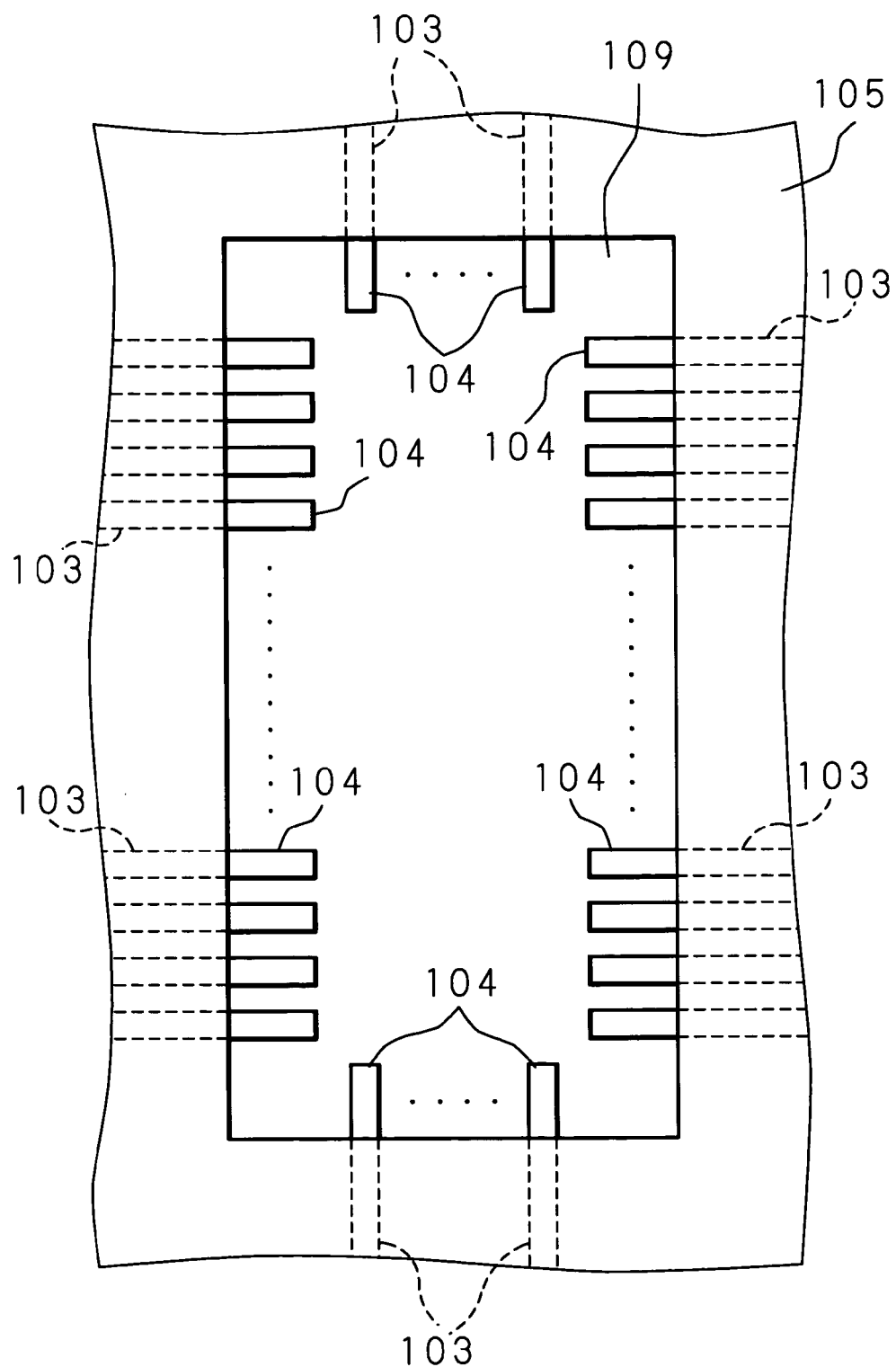
FIG. 2 is a plan view showing essential parts of a conventional flexible substrate.

In a conventional example, as shown in FIG. 1, after connecting the semiconductor chip 106 to the flexible substrate 101, a gap is generated between the flexible substrate 101 and the element surface of the semiconductor chip 106 due to the Au protruding electrodes 107 and the semiconductor chip connecting electrodes 104 connected by Au—Sn eutectic bonding (however, the gap is filled with the synthetic resin 108 in the later process).

On the other hand, in this embodiment, as shown in FIG. 3, the gap is filled with the solder resist 5 with a thickness of just 7 μm, and the surface of the semiconductor chip 6 and the flexible substrate 1 adhere closely, and therefore it is possible to obtain a sealing effect without filling interface resin. However, in order to lengthen the moisture penetration path, the periphery of the semiconductor chip 6 is sealed with synthetic resin 8.

As the coating method of the synthetic resin 8, first, the synthetic resin 8 is continuously dropped from a dispenser onto the flexible substrate 1 along the edge of the semiconductor chip 6. Consequently, the synthetic resin 8 spreads on the flexible substrate 1 along the edge of the semiconductor chip 6, and seals the space between the edge of the semiconductor chip 6 and the flexible substrate 1. Thereafter, mounting of the semiconductor chip 6 onto the flexible substrate 1 is completed by thermosetting the synthetic resin 8.

This coating method of the synthetic resin 8 is the same as the conventional example. In the present invention, however, only the periphery of the semiconductor chip 6 is coated, and the present invention does not have an unfilled portion in the interface and has more advantage in the production process.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A flexible substrate to be connected to a semiconductor chip, comprising:
    an insulting film;
    a plurality of internal connecting electrodes, provided on a surface of the insulating film, connected to the semiconductor chip;
    a plurality of wires, provided on the surface of the insulating film, connecting the internal connecting electrodes and a plurality of external connecting electrodes connected to external devices; and
    a protective film comprising a solder resist coating the internal connecting electrodes, the wires and the surface of the insulating film.

2. A semiconductor device comprising:
    a semiconductor chip; and
    a flexible substrate connected to the semiconductor chip, the flexible substrate including:
        an insulating film;
        a plurality of internal connecting electrodes, provided on a surface of the insulating film, connected to the semiconductor chip;
        a plurality of wires, provided on the surface of the insulating film, connecting the internal connecting electrodes and a plurality of external connecting electrodes connected to external devices; and
        a protective film coating the internal connecting electrodes, the wires and the surface of the insulating film,
    wherein the semiconductor chip is mounted by positioning an element surface so as to face a surface of the flexible substrate and connecting the element surface to the internal connecting electrodes of the flexible substrate, and
    wherein the protective film comprises a solder resist and directly contacts respective upper surfaces of each of: the internal connecting electrodes, the wires, and the insulating film.

3. A semiconductor device comprising:
    a semiconductor chip; and
    a flexible substrate supporting the semiconductor chip, the flexible substrate including:
        an insulating film;
        a plurality of internal connecting electrodes, provided on a surface of the insulating film and at least partially under the chip, to be electrically connected to the semiconductor chip;

a plurality of wires, provided on the surface of the insulating film, connecting the internal connecting electrodes and a plurality of external connecting electrodes connected to external devices; and a protective film comprising a solder resist for at least partially coating each of: the internal connecting electrodes, the wires and the surface of the insulating film, wherein the semiconductor chip is mounted by positioning an element surface so as to face a surface of the flexible substrate and connecting the element surface to the internal connecting electrodes of the flexible substrate.

4. The semiconductor device according to claim 3, wherein a periphery of the semiconductor chip is sealed with synthetic resin.

5. The semiconductor device of claim 3, wherein the protective film comprising the solder resist directly contacts respective upper surfaces of each of: the internal connecting electrodes, the wires, and the insulating film.

6. The semiconductor device of claim 3, wherein the chip is an LCD driver chip.

* * * * *